US011232846B2

(12) United States Patent
Xu et al.

(10) Patent No.: US 11,232,846 B2
(45) Date of Patent: Jan. 25, 2022

(54) GATE DRIVE UNIT AND DRIVING METHOD THEREOF AND GATE DRIVE CIRCUIT

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Zhuo Xu, Beijing (CN); Yuanbo Zhang, Beijing (CN); Yajie Bai, Beijing (CN); Heecheol Kim, Beijing (CN); Peng Liang, Beijing (CN); Hailong Wu, Beijing (CN); Yi Dan, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 171 days.

(21) Appl. No.: 16/191,746

(22) Filed: Nov. 15, 2018

(65) Prior Publication Data

US 2019/0228830 A1 Jul. 25, 2019

(30) Foreign Application Priority Data

Jan. 25, 2018 (CN) .......................... 201810072670.2

(51) Int. Cl.
*G11C 19/00* (2006.01)
*G11C 19/28* (2006.01)
*G09G 3/20* (2006.01)

(52) U.S. Cl.
CPC ............. *G11C 19/287* (2013.01); *G09G 3/20* (2013.01); *G11C 19/28* (2013.01);
(Continued)

(58) Field of Classification Search
None
See application file for complete search history.

(56) References Cited

U.S. PATENT DOCUMENTS 8,102,357 B2 * 1/2012 Kajiwara ............. G09G 3/3696
326/83
8,648,849 B2 * 2/2014 Ito .................. H03K 19/018521
345/212
(Continued)

FOREIGN PATENT DOCUMENTS

CN  101241765 A    8/2008
CN  102708777 A   10/2012
(Continued)

OTHER PUBLICATIONS

First Office Action dated Aug. 4, 2020 corresponding to Chinese application No. 201810072670.2.
(Continued)

*Primary Examiner* — Tuan T Lam
(74) *Attorney, Agent, or Firm* — Nath, Goldberg & Meyer; Joshua B. Goldberg

(57) ABSTRACT

The present disclosure provides a gate drive unit, a driving method thereof and a gate drive circuit. The gate drive unit includes a shift register and a plurality of output control modules. Each of the output control modules is connected to a corresponding clock scanning signal line and a corresponding first scanning signal output terminal, respectively. Each of the output control modules includes a first output control submodule and an output reset submodule. The first output control submodule is connected to a signal output terminal of the shift register, the corresponding clock scanning signal line and the corresponding first scanning signal output terminal, and configured to send a clock scanning signal of the corresponding clock scanning signal line to the
(Continued)

corresponding first scanning signal output terminal, under control of a signal outputted by the signal output terminal of the shift register.

18 Claims, 11 Drawing Sheets

(52) U.S. Cl.
CPC ............... *G09G 2300/0408* (2013.01); *G09G 2300/0426* (2013.01); *G09G 2310/0267* (2013.01); *G09G 2310/0286* (2013.01); *G09G 2310/08* (2013.01)

(56) References Cited

U.S. PATENT DOCUMENTS

| | | | | |
|---|---|---|---|---|
| 10,540,938 | B2 * | 1/2020 | Kim ..................... | G09G 3/3677 |
| 2002/0158666 | A1 * | 10/2002 | Azami ............. | H03K 19/01721 |
| | | | | 326/83 |
| 2008/0315918 | A1 * | 12/2008 | Luo .................. | H03K 19/09441 |
| | | | | 326/80 |
| 2011/0058640 | A1 * | 3/2011 | Shang .................. | G11C 19/184 |
| | | | | 377/64 |
| 2011/0316833 | A1 * | 12/2011 | Chang ..................... | G09G 3/20 |
| | | | | 345/211 |
| 2014/0159997 | A1 * | 6/2014 | Chen ..................... | G09G 3/3611 |
| | | | | 345/87 |
| 2015/0228354 | A1 * | 8/2015 | Qing .................... | G09G 3/3674 |
| | | | | 345/100 |
| 2015/0317954 | A1 * | 11/2015 | Jang ....................... | G11C 19/28 |
| | | | | 345/213 |
| 2016/0189683 | A1 * | 6/2016 | Chen .................... | G09G 3/3677 |
| | | | | 345/213 |
| 2016/0328612 | A1 * | 11/2016 | Ahn ...................... | G01N 33/004 |
| 2016/0358666 | A1 * | 12/2016 | Pang .................... | G09G 3/3688 |
| 2017/0039968 | A1 * | 2/2017 | Chen .................... | G09G 3/3677 |
| 2017/0061855 | A1 * | 3/2017 | Tsai .................... | G09G 3/3266 |
| 2017/0330526 | A1 * | 11/2017 | Fan ...................... | G09G 3/3677 |
| 2018/0261177 | A1 * | 9/2018 | Han .................... | G09G 3/3677 |
| 2019/0006018 | A1 * | 1/2019 | Fang .................... | G11C 19/287 |
| 2019/0073948 | A1 * | 3/2019 | Wang .................... | G09G 3/3266 |
| 2019/0164497 | A1 * | 5/2019 | Wang .................... | G11C 19/28 |
| 2019/0180671 | A1 * | 6/2019 | Cheng .................. | G11C 19/28 |
| 2019/0206294 | A1 * | 7/2019 | Tian ..................... | G11C 19/28 |

FOREIGN PATENT DOCUMENTS

| | | |
|---|---|---|
| CN | 103236272 A | 8/2013 |
| CN | 105702189 A | 6/2016 |
| CN | 105719593 A | 6/2016 |
| CN | 105869563 A | 8/2016 |
| CN | 106023943 A | 10/2016 |
| CN | 106952606 A | 7/2017 |
| CN | 107123391 A | 9/2017 |
| WO | 2012008186 A1 | 1/2012 |

OTHER PUBLICATIONS

Second Office Action dated Feb. 7, 2021 corresponding to Chinese application No. 201810072670.2.

* cited by examiner

GATE DRIVE UNIT AND DRIVING METHOD THEREOF AND GATE DRIVE CIRCUIT

TECHNICAL FIELD

The present disclosure relates to the field of display technology, and in particular, relates to a gate drive unit and a driving method thereof and a gate drive circuit.

BACKGROUND

Most of the existing display devices employ a design of a Gate Drive On Array (GOA), which, compared to the existing Chip On Film (COF) process or the Chip On Glass (COG) process, not only reduces costs, but also makes possible an aesthetic design with symmetry of two sides of the panel, meanwhile omitting a bonding area of a gate drive circuit and a peripheral wiring space.

A GOA circuit generally includes a plurality of cascaded gate drive units. The existing gate drive unit is a shift register. Each of the shift registers in the GOA circuit has a signal output terminal connected to one corresponding gate line, respectively, and the shift register outputs a scanning signal to drive the corresponding gate line.

In the existing GOA circuit, each stage of the shift registers serves to drive only one gate line, so that the entire gate drive circuit occupies a large space, which is detrimental to realizing a narrow frame.

SUMMARY

The present disclosure proposes a gate drive unit, a driving method thereof, and a gate drive circuit including the gate drive unit.

In one aspect of the present disclosure, there is provided a gate drive unit, including a shift register and a plurality of output control modules connected to the shift register, each of the plurality of output control modules connected to a clock scanning signal line and a first scanning signal output terminal corresponding to the output control module, respectively. Each of the plurality of output control modules includes a first output control submodule and an output reset submodule. The first output control submodule is connected to a signal output terminal of the shift register, the clock scanning signal line corresponding to the output control module, and the first scanning signal output terminal corresponding to the output control module, respectively, and the first output control submodule is configured to send a clock scanning signal of the clock scanning signal line to the first scanning signal output terminal, under control of a signal outputted by the signal output terminal of the shift register. The output reset submodule is connected to a pull-down node of the shift register and the first scanning signal output terminal, respectively, and the output reset submodule is configured to reset a first scanning signal outputted by the first scanning signal output terminal, under control of a potential of the pull-down node of the shift register.

In some embodiments, the first output control submodule may include a first transistor. A control terminal of the first transistor is connected to the signal output terminal of the shift register, a first terminal of the first transistor is connected to the clock scanning signal line, and a second terminal of the first transistor is connected to the first scanning signal output terminal.

In some embodiments, the output reset submodule may include a second transistor. A control terminal of the second transistor is connected to the pull-down node of the shift register, a first terminal of the second transistor is connected to the first scanning signal output terminal, and a second terminal of the second transistor is connected to a first power supply.

In some embodiments, each of the plurality of output control modules may further include a second output control submodule. The second output control submodule is connected to a second scanning signal output terminal corresponding to the output control module and the first scanning signal output terminal, respectively, and the second output control submodule is configured to provide a second scanning signal having a reversed phase with respective to the first scanning signal to the second scanning signal output terminal, under control of the first scanning signal outputted by the first scanning signal output terminal.

In some embodiments, the second output control submodule may include a third transistor, a fourth transistor, a fifth transistor and a sixth transistor. A control terminal and a first terminal of the third transistor are connected to a second power supply, and a second terminal of the third transistor is connected to both of a first terminal of the fourth transistor and a control terminal of the fifth transistor. A control terminal of the fourth transistor is connected to the first scanning signal output terminal, and a second terminal of the fourth transistor is connected to the first power supply. A first terminal of the fifth transistor is connected to a third power supply, and a second terminal of the fifth transistor is connected to the second scanning signal output terminal. A control terminal of the sixth transistor is connected to the first scanning signal output terminal, a first terminal of the sixth transistor is connected to a fourth power supply, and a second terminal of the sixth transistor is connected to the second scanning signal output terminal.

In some embodiments, the shift register may include a pre-charge/reset module, a pull-down control module, a pull-up module and a pull-down module, and the shift register further may include a pre-charge signal input terminal, a reset signal input terminal and the signal output terminal. The pre-charge/reset module, the pull-down control module, and the pull-up module are connected to a pull-up node of the shift register, the pull-down module and the pull-down control module are connected to the pull-down node, the pre-charge/reset module is connected to the pre-charge signal input terminal and the reset signal input terminal, and the pull-up module and the pull-down module are connected to the signal output terminal. The pre-charge/reset module may be configured to perform a pre-charge process or a reset process on the pull-up node, under control of a pre-charge signal inputted by the pre-charge signal input terminal and a reset signal inputted by the reset signal input terminal, respectively. The pull-down control module may be configured to control a potential of the pull-down node under control of a potential of the pull-up node. The pull-up module may be configured to pull up a signal outputted by the signal output terminal under control of a potential of the pull-up node. The pull-down module may be configured to pull down a signal outputted by the signal output terminal under control of a potential of the pull-down node.

In some embodiments, the pre-charge/reset module may include a seventh transistor and an eighth transistor. A control terminal of the seventh transistor is connected to the pre-charge signal input terminal, a first terminal of the seventh transistor is connected to a fifth power supply, and a second terminal of the seventh transistor is connected to the pull-up node. A control terminal of the eighth transistor is connected to the reset signal input terminal, a first terminal of the eighth transistor is connected to the pull-up node, and a second terminal of the eighth transistor is connected to a sixth power supply.

In some embodiments, the pull-up module may include a thirteenth transistor and a first capacitor. A control terminal of the thirteenth transistor is connected to the pull-up node, a first terminal of the thirteenth transistor is connected to a first clock control signal line, and a second terminal of the thirteenth transistor is connected to the signal output terminal A first terminal of the first capacitor is connected to the pull-up node, and a second terminal of the first capacitor is connected to the signal output terminal.

In some embodiments, the pull-down module may include a fourteenth transistor. A control terminal of the fourteenth transistor is connected to the pull-down node, a first terminal of the fourteenth transistor is connected to the signal output terminal, and a second terminal of the fourteenth transistor is connected to the sixth power supply.

In some embodiments, the pull-down control module may include a ninth transistor and a tenth transistor. A control terminal and a first terminal of the ninth transistor are both connected to the fifth power supply or both connected to a second clock control signal line, and a second terminal of the ninth transistor is connected to the pull-down node. A control terminal of the tenth transistor is connected to the pull-up node, a first terminal of the tenth transistor is connected to the pull-down node, and a second terminal of the tenth transistor is connected to the sixth power supply.

In some embodiments, the pull-down control module may include a ninth transistor, a tenth transistor, an eleventh transistor and a twelfth transistor. A control terminal and a first terminal of the ninth transistor are connected to the fifth power supply, and a second terminal of the ninth transistor is connected to a first terminal of the tenth transistor and a control terminal of the eleventh transistor. A control terminal of the tenth transistor is connected to the pull-up node, and a second terminal of the tenth transistor is connected to the sixth power supply. A first terminal of the eleventh transistor is connected to the fifth power supply, and a second terminal of the eleventh transistor is connected to the pull-down node. A control terminal of the twelfth transistor is connected to the pull-up node, a first terminal of the twelfth transistor is connected to the pull-down node, and a second terminal of the twelfth transistor is connected to the sixth power supply.

In some embodiments, a number of the plurality of output control modules may be in a range of 2 to 4.

In another aspect of the present disclosure, there is provided a gate drive circuit, including a plurality of cascaded gate drive units, wherein the plurality of gate drive units include at least one gate drive unit according to the present disclosure. Except the gate drive unit at the last stage, a shift register of the gate drive unit at each stage has a signal output terminal connected to a pre-charge signal input terminal of a shift register of the gate drive unit at the next stage. Except the gate drive unit at the first stage, the shift register of the gate drive unit at each stage has the signal output terminal connected to a reset signal input terminal of a shift register of the gate drive unit at the previous stage.

In one aspect of the present disclosure, there is provided a driving method of a gate drive unit, the gate drive unit including a shift register and a plurality of output control modules connected to the shift register, each of the plurality of output control modules connected to a clock scanning signal line and a first scanning signal output terminal corresponding to the output control module, respectively. Each of the plurality of output control modules includes a first output control submodule and an output reset submodule. The first output control submodule is connected to a signal output terminal of the shift register, the clock scanning signal line corresponding to the output control module, and the first scanning signal output terminal corresponding to the output control module, respectively, and the first output control submodule is configured to send a clock scanning signal of the clock scanning signal line to the first scanning signal output terminal, under control of a signal outputted by the signal output terminal of the shift register. The output reset submodule is connected to a pull-down node of the shift register and the first scanning signal output terminal, respectively, and the output reset submodule is configured to reset a first scanning signal outputted by the first scanning signal output terminal, under control of a potential of the pull-down node of the shift register. The driving method includes: in an output period, outputting, by the signal output terminal of the shift register, an effective electric level, sending, by the first output control submodule of each of the plurality of output control modules, the clock scanning signal of the clock scanning signal line to the first scanning signal output terminal; and in a reset period, under control of the potential of the pull-down node of the shift register, resetting, by the output reset submodule, the first scanning signal outputted by the first scanning signal output terminal.

DETAILED DESCRIPTION

In order that one skilled in the art can understand technical solutions of the present disclosure better, a gate drive unit and a driving method thereof and a gate drive circuit according to embodiments of the present disclosure are described below in further detail in conjunction with accompanying drawings.

A transistor in the present disclosure may be a thin film transistor or a field effect transistor or other switching device having the same characteristics. A transistor generally includes a gate, a source and a drain. The source and the drain of the transistor are symmetric in structure, thus they are interchangeable as necessary. In the context of the present disclosure, a "control terminal" refers to the gate of a transistor, one of a "first terminal" and a "second terminal" refers to the source, and the other refers to the drain.

Furthermore, transistors can be classified into N-type transistors and P-type transistors according to their characteristics. If a transistor is an N-type transistor, then its ON voltage is a high electric level voltage, and its OFF voltage is a low electric level voltage. If a transistor is a P-type transistor, then its ON voltage is a low electric level voltage, and its OFF voltage is a high electric level voltage. Exemplary descriptions of embodiments of the present disclosure will take a case where transistors are all N-type transistors as an example. However, it should be recognized that the present disclosure is not limited thereto.

Figure 1A:
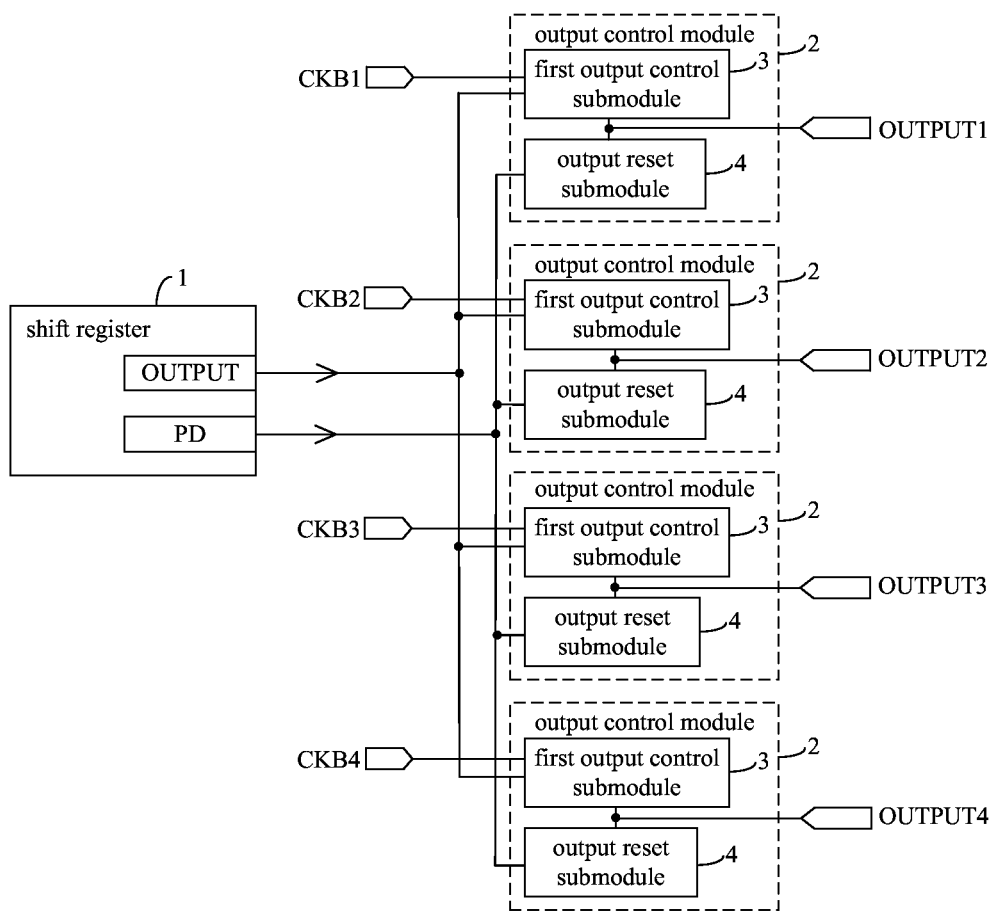
FIG. 1A is a schematic diagram of a structure of a gate drive unit according to an embodiment of the present disclosure.
Figure 1B:
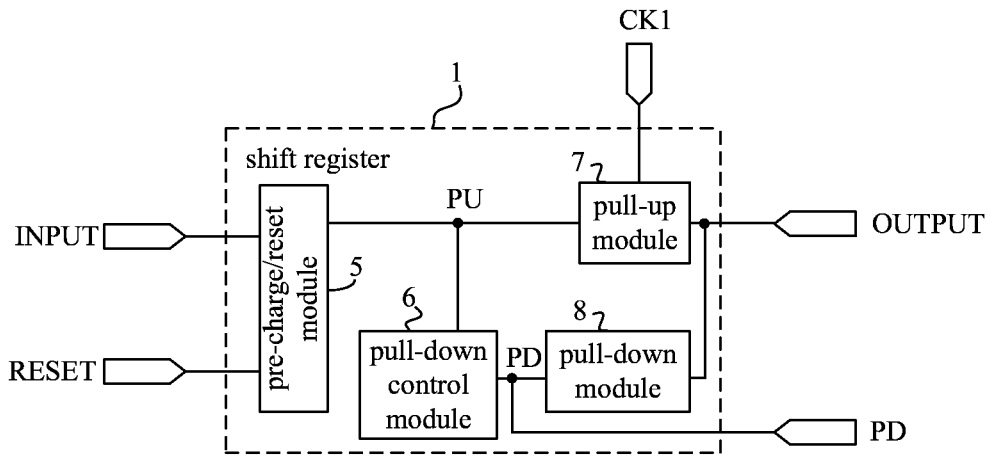
FIG. 1B is a schematic diagram of a structure of the shift register of FIG. 1A.
Figure 1C:
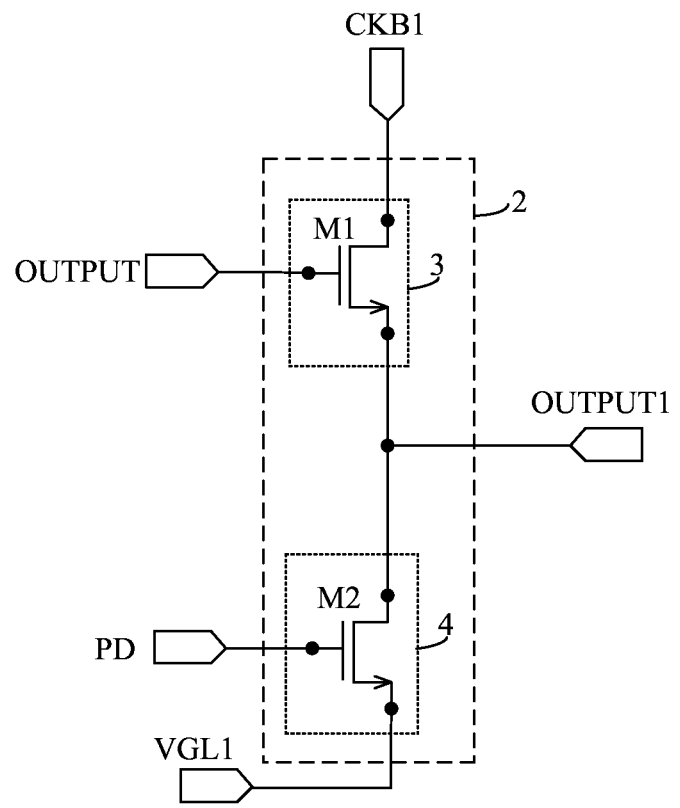
FIG. 1C is a schematic diagram of a circuit structure of one output control module of FIG. 1A.

FIG. 1A is a schematic diagram of a structure of a gate drive unit according to an embodiment of the present disclosure, FIG. 1B is a schematic diagram of a structure of the shift register of FIG. 1A, and FIG. 1C is a schematic diagram of a circuit structure of one output control module of FIG. 1A.

As shown in FIGS. 1A to 1C, the gate drive unit according to an embodiment of the present disclosure may include a shift register 1 and a plurality of output control modules 2 connected to the shift register 1. Each of the output control modules 2 is connected to a clock scanning signal line and a first scanning signal output terminal corresponding to the output control module 2, respectively. As shown in FIG. 1, the shift register 1 is connected to four control modules 2, and each of the control modules 2 is connected to one clock scanning signal line and one first scanning signal output terminal, respectively. The scanning signal lines corresponding to the control modules 2 are CKB1, CKB2, CKB3, and CKB4, and the first scanning signal output terminals corresponding to the control modules 2 are OUTPUT1, OUTPUT2, OUTPUT3, and OUTPUT4. However, the present disclosure is not limited thereto. The number of the control modules 2 connected to the shift register 1 may be two, three or more than four.

Each of the output control modules 2 may include a first output control submodule 3 and an output reset submodule 4.

The first output control submodule 3 is connected to a signal output terminal OUTPUT of the shift register 1, the clock scanning signal line (one of CKB1, CKB2, CKB3, and CKB4) and the first scanning signal output terminal (one of OUTPUT1, OUTPUT2, OUTPUT3, and OUTPUT4) corresponding to the output control module 2, respectively. The first output control submodule 3 is configured to send a clock scanning signal of the clock scanning signal line (one of CKB1, CKB2, CKB3, and CKB4) to the first scanning signal output terminal (one of OUTPUT1, OUTPUT2, OUTPUT3, and OUTPUT4), under the control of a signal outputted by the signal output terminal OUTPUT of the shift register 1. Each of the first scanning signal output terminals OUTPUT1, OUTPUT2, OUTPUT3, and OUTPUT4 may output a first scanning signal, respectively.

The output reset submodule 4 is connected to a pull-down node PD of the shift register 1, and the first scanning signal output terminal (one of OUTPUT1, OUTPUT2, OUTPUT3, and OUTPUT4) corresponding to the output control module 2, respectively. The output reset submodule 4 is configured to reset the first scanning signal outputted by the first scanning signal output terminal (one of OUTPUT1, OUTPUT2, OUTPUT3, and OUTPUT4), under the control of a potential of the pull-down node PD of the shift register 1.

Different from the prior art in which a shift register directly outputs a scanning signal to a gate line, in the present disclosure, a signal outputted by the signal output terminal OUTPUT of the shift register 1 is used as a control signal, to control the plurality of the first output control submodule 3 to each send a clock scanning signal of the clock scanning signal line connected thereto (one of CKB1, CKB2, CKB3, and CKB4) to the corresponding first scanning signal output terminal (one of OUTPUT1, OUTPUT2, OUTPUT3, and OUTPUT4). Each of the first scanning signal output terminal OUTPUT1, OUTPUT2, OUTPUT3, and OUTPUT4 is connected to corresponding one of gate lines (not shown), respectively, so as to realize one shift register capable of driving multiple gate lines.

In a case where the number of gate lines in a display panel is not changed, compared to the prior art, the technical solution of the present disclosure can effectively reduce the number of shift registers and the number of signal wirings for connecting cascaded shift registers as well, so that the entire gate drive circuit occupies a relatively reduced space, which is favorable for realizing a narrow frame.

Referring to FIG. 1B, in the present disclosure, the shift register 1 may include a pre-charge/reset module 5, a pull-down control module 6, a pull-up module 7 and a pull-down module 8. The shift register 1 may also include a pre-charge signal input terminal INPUT, a reset signal input terminal RESET and a signal output terminal OUTPUT. The pre-charge/reset module 5, the pull-down control module 6, and the pull-up module 7 are connected to a pull-up node PU of the shift register 1, the pull-down module 8 and the pull-down control module 6 are connected to the pull-down node PD of the shift register 1, the pre-charge/reset module 5 is connected to the pre-charge signal input terminal INPUT and the reset signal input terminal RESET, and the pull-up module 7 and the pull-down module 8 are connected to the signal output terminal OUTPUT.

The pre-charge/reset module 5 is configured to perform a pre-charge process or a reset process on the pull-up node PU, under the control of a pre-charge signal inputted by the pre-charge signal input terminal INPUT and a reset signal inputted by the reset signal input terminal RESET, respectively. The pull-down control module 6 is configured to control a potential of the pull-down node PD under the control of a potential of the pull-up node PU. The pull-up module 7 is configured to pull up a signal outputted by the signal output terminal OUTPUT under the control of the potential of the pull-up node PU. The pull-down module 8 is configured to pull down the signal outputted by the signal output terminal OUTPUT under the control of the potential of the pull-down node PD.

The following will describe in further detail a specific operation process of the gate drive unit according to the present embodiment.

In the present embodiment, the operation process of the gate drive unit includes three periods: a pre-charge period, an output period and a reset period. The shift register 1 outputs an effective electric level in the output period. In the context of the present disclosure, the "effective electric level" refers to a driving voltage which can drive a gate line. When a switching transistor connected to a gate line in a display region of a display panel is an N-type transistor, the effective electric level is a high electric level; when a switching transistor connected to a gate line in a display region of a display panel is a P-type transistor, the effective electric level is a low electric level. In an embodiment of the present disclosure, description is given taking an example in which the effective electric level is a high electric level.

In the pre-charge period, in the shift register 1, the pre-charge/reset module 5 performs the pre-charge process on the pull-up node PU, under the control of a pre-charge signal supplied by the pre-charge signal input terminal INPUT, causing the pull-up node PU to be in a high electric level state. The pull-up module 7 provides a first clock control signal in a low electric level state supplied by a first clock control signal line CK1 to the signal output terminal OUTPUT of the shift register 1, causing the signal outputted by the signal output terminal OUTPUT of the shift register 1 to be at a low electric level. The pull-down control module 6 controls the potential of the pull-down node PD to be in a low electric level state under the control of the potential of the pull-up node PU.

In the pre-charge period, in the output control module 2, neither the first output control submodule 3 nor the output reset submodule 4 operates, causing the first scanning signal output terminal (one of OUTPUT1, OUTPUT2, OUTPUT3, and OUTPUT4) connected to the output control module 2 to maintain a low electric level state after the reset period of a previous cycle.

In the output period, in the shift register 1, the pre-charge signal provided by the pre-charge signal input terminal INPUT is in a low electric level state, the pre-charge/reset module 5 generates no output, causing the pull-up node PU to be in a floating state. The first clock control signal provided by the first clock control signal line CK1 is in a high electric level state, and the pull-up module 7 provides the first clock control signal in the high electric level state to the signal output terminal of the shift register 1, causing the signal outputted by the signal output terminal OUTPUT of the shift register 1 to be at a high electric level. Bootstrap of a capacitor in the pull-up module 7 may pull the potential of the pull-up node PU up to a higher electric level, causing the potential of the pull-down node PD to still maintain a low electric level state.

In the output period, in the output control module 2, the high electric level signal outputted by the signal output terminal OUTPUT of the shift register 1 causes the first output control submodule 3 to operate, that is, the first output control submodule 3 sends the clock scanning signal of the clock scanning signal line (one of CKB1, CKB2, CKB3, and CKB4) to the first scanning signal output terminal (one of OUTPUT1, OUTPUT2, OUTPUT3, and OUTPUT4), under the control of the signal outputted by the signal output terminal OUTPUT of the shift register 1. The first scanning signal output terminals OUTPUT1, OUTPUT2, OUTPUT3, and OUTPUT4 may output first scanning signals, respectively.

In the present embodiment, to realize that gate lines connected to the gate drive unit can be driven sequentially one by one, it is required that the clock scanning signals of the clock scanning signal lines connected to the respective first output control submodules 3 are in an effective electric level, respectively, at sequentially staggered points of time. In this case, respective first scanning signal output terminals will sequentially output a driving voltage having an effective electric level.

In the reset period, in the shift register 1, the pre-charge/reset module 5 performs the reset process on the pull-up node PU, under the control of a reset signal provided by the reset signal input terminal RESET, causing the pull-up node PU to be in a low electric level state and causing the pull-up module 7 to stop operation. The pull-down control module 6 controls a potential of the pull-down node PD to be in a high electric level state, under the control of a potential of the pull-up node PU. Under the control of the potential of the pull-down node PD, the pull-down module 8 provides a low electric level signal supplied by a low electric level power supply to the signal output terminal OUTPUT of the shift register 1, causing a signal outputted by the signal output terminal OUTPUT of the shift register 1 to be at a low electric level, that is, realizing reset.

In the reset period, in the output control module 2, the first output control submodule 3 stops operation, the potential of the pull-down node PD of the shift register 1 causes the output reset submodule 4 to operate, and the output reset submodule 4 resets the first scanning signal outputted by the first scanning signal output terminal, causing the first scanning signal outputted by the first scanning signal output terminal to be at a low electric level.

According to a technical solution of the present disclosure, by providing a plurality of output control modules 2 connected to the signal output terminal OUTPUT of the shift register 1, when driving is performed, the signal outputted by the signal output terminal OUTPUT of the shift register 1 serves as a control signal controlling the first output control submodule 3 to send the clock scanning signal of the clock scanning signal line (one of CKB1, CKB2, CKB3, and CKB4), connected thereto, to the corresponding first scanning signal output terminal (one of OUTPUT1, OUTPUT2, OUTPUT3, and OUTPUT4), thereby realizing that one shift register can drive multiple gate lines, and in turn effectively reducing the number of shift registers required in the gate drive circuit.

Referring to FIG. 1C, in the output control module 2, a first power supply VGL1 may supply a low electric level voltage. The first output control submodule 3 may include a first transistor M1. A control terminal of the first transistor M1 is connected to the signal output terminal OUTPUT of the shift register 1, a first terminal of the first transistor M1 is connected to the clock scanning signal line (for example, CKB1), and a second terminal of the first transistor M1 is connected to the first scanning signal output terminal (for example, OUTPUT1).

The output reset submodule 4 may include a second transistor M2. A control terminal of the second transistor M2 is connected to the pull-down node PD of the shift register 1, a first terminal of the second transistor M2 is connected to the first scanning signal output terminal (for example, OUTPUT1), and a second terminal of the second transistor M2 is connected to the first power supply VGL1.

Operation process of the first transistor M1 and the second transistor M2 in each period will be described later.

In the present embodiment, every two transistors added (i.e. the first transistor M1 and the second transistor M2) may enable the gate drive unit to drive one more gate line. Compared to a technical solution of the prior art in which one shift register (generally including six or more transistors) corresponds to one gate line, the technical solution of the present disclosure can considerably reduce the total number of transistors in the gate drive circuit, which is favorable to narrow frame.

In the present embodiment, if more output control modules are provided in the gate drive unit, the gate drive unit may drive more gate lines, but there also need to be more clock scanning signal lines (corresponding to the number of the output control modules), as well as more wirings occupying more space, which will impose higher requirements for a control chip for controlling the clock scanning signal lines. For this reason, there may be 2 to 4 output control modules in one gate drive unit, but the present disclosure is not limited thereto. It should be known to one skilled in the art that, in order to implement the technical solution of the present disclosure, simply more than one output control modules will do.

Figure 2:
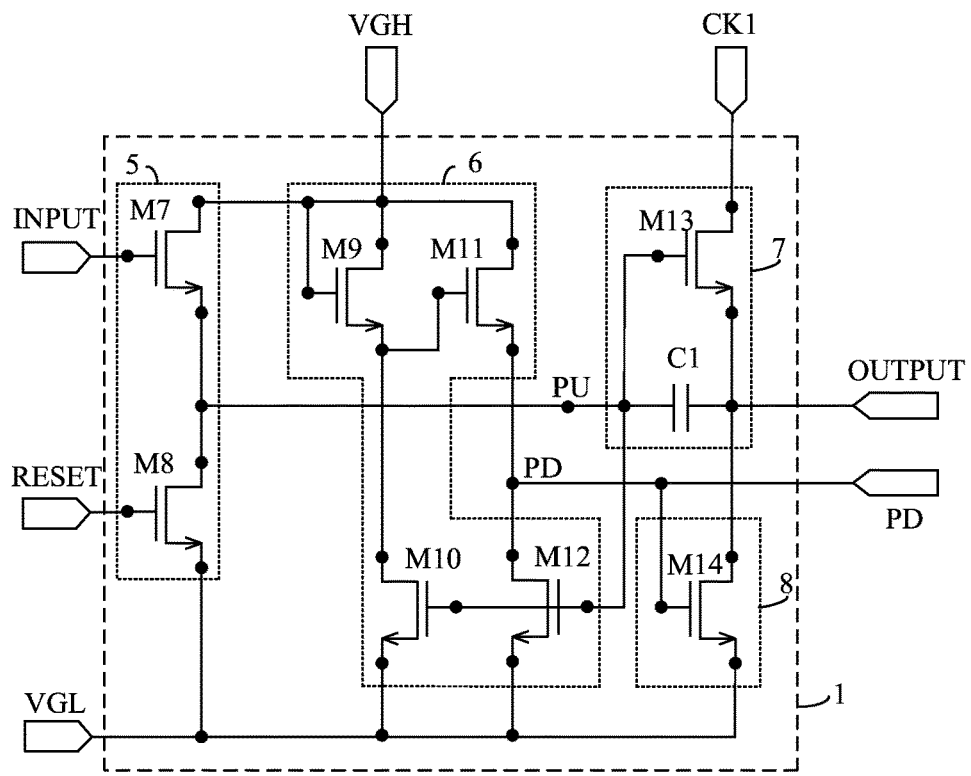
FIGS. 2 to 4 are schematic diagrams of circuit structures of the shift register of FIG. 1A.
Figure 3:
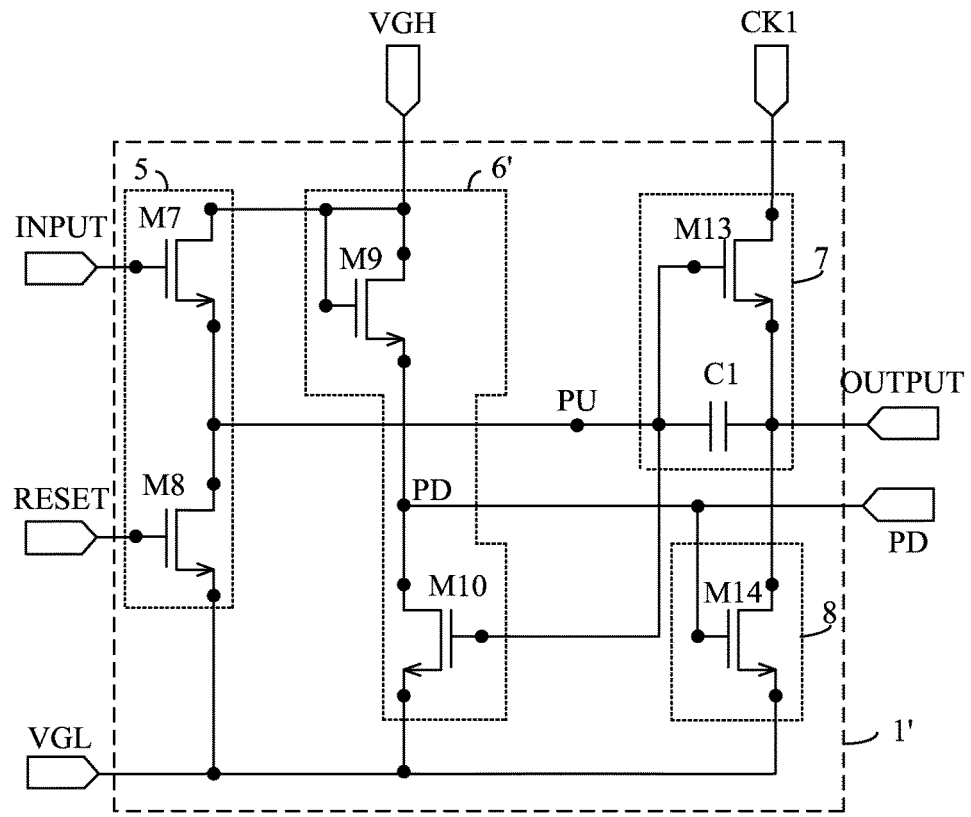
Figure 4:
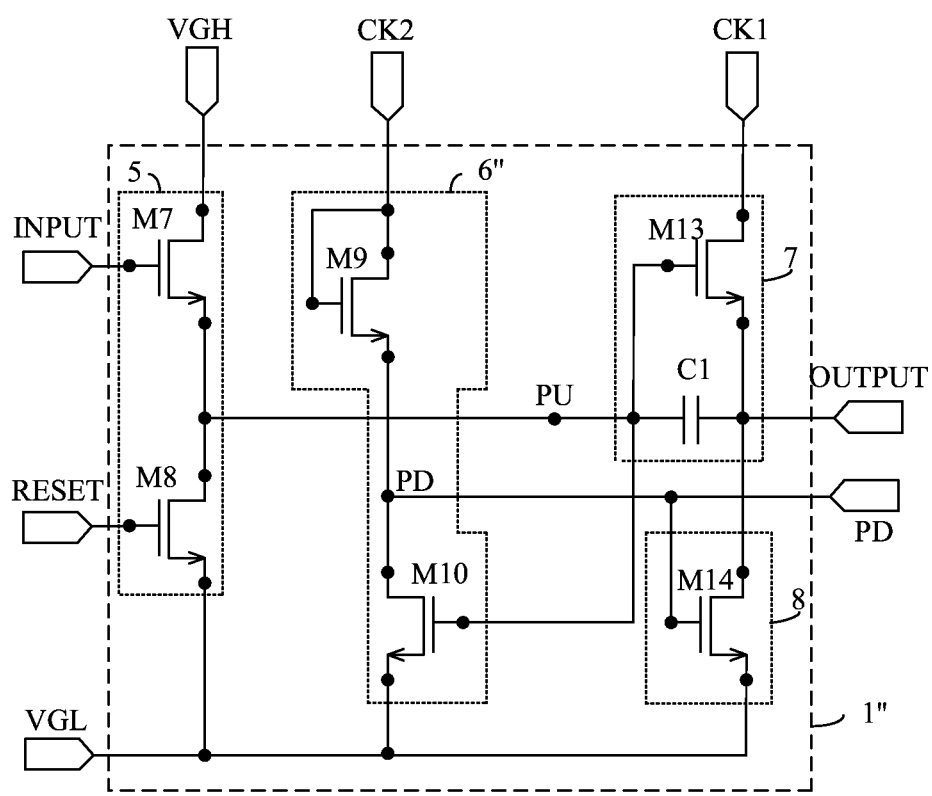

Furthermore, the technical solution of the present disclosure imposes no limits on a specific circuit structure of the shift register. Exemplary structures of the shift register are described below in conjunction with FIGS. 2 to 4. In FIGS. 2 to 4, a fifth power supply VGH supplies a high electric level voltage, and a sixth power supply VGL supplies a low electric level voltage, but the present disclosure is not limited thereto.

As shown in FIG. 2, the pre-charge/reset module 5 of the shift register 1 may include a seventh transistor M7 and an eighth transistor M8. A control terminal of the seventh transistor M7 is connected to the pre-charge signal input terminal INPUT, a first terminal of the seventh transistor M7 is connected to the fifth power supply VGH, and a second terminal of the seventh transistor M7 is connected to the pull-up node PU. A control terminal of the eighth transistor M8 is connected to the reset signal input terminal RESET, a first terminal of the eighth transistor M8 is connected to the pull-up node PU, and a second terminal of the eighth transistor M8 is connected to the sixth power supply VGL.

The pull-down control module 6 of the shift register 1 may include a ninth transistor M9, a tenth transistor M10, an eleventh transistor M11 and a twelfth transistor M12. A control terminal and a first terminal of the ninth transistor M9 are connected to the fifth power supply VGH, and a second terminal of the ninth transistor M9 is connected to a first terminal of the tenth transistor M10 and a control terminal of the eleventh transistor M11. A control terminal of the tenth transistor M10 is connected to the pull-up node PU, and a second terminal of the tenth transistor M10 is connected to the sixth power supply VGL. A first terminal of the eleventh transistor M11 is connected to the fifth power supply VGH, and a second terminal of the eleventh transistor M11 is connected to the pull-down node PD. A control terminal of the twelfth transistor M12 is connected to the pull-up node PU, a first terminal of the twelfth transistor M12 is connected to the pull-down node PD, and a second terminal of the twelfth transistor M12 is connected to the sixth power supply VGL.

The pull-up module 7 of the shift register 1 may include a thirteenth transistor M13 and a first capacitor C1. A control terminal of the thirteenth transistor M13 is connected to the pull-up node PU, a first terminal of the thirteenth transistor M13 is connected to the first clock control signal line CK1, and a second terminal of the thirteenth transistor M13 is connected to the signal output terminal OUTPUT. A first terminal of the first capacitor C1 is connected to the pull-up node PU, and a second terminal of the first capacitor C1 is connected to the signal output terminal OUTPUT.

The pull-down module 8 of the shift register 1 may include a fourteenth transistor M14. A control terminal of the fourteenth transistor M14 is connected to the pull-down node PD, a first terminal of the fourteenth transistor M14 is connected to the signal output terminal OUTPUT, and a second terminal of the fourteenth transistor M14 is connected to the sixth power supply VGL.

As shown in FIG. 3, unlike the shift register 1 shown in FIG. 2, a shift register 1' shown in FIG. 3 has a pull-down control module 6' including only a ninth transistor M9 and a tenth transistor M10. A control terminal and a first terminal of the ninth transistor M9 are both connected to the fifth power supply VGH, and a second terminal of the ninth transistor M9 is connected to the pull-down node PD. A control terminal of the tenth transistor M10 is connected to the pull-up node PU, a first terminal of the tenth transistor M10 is connected to the pull-down node PD, and a second terminal of the tenth transistor M10 is connected to the sixth power supply VGL.

Compared to the shift register 1 shown in FIG. 2, the shift register 1' shown in FIG. 3 includes less transistors, and occupies smaller space, which is more favorable to realizing narrow frame of the display panel.

As shown in FIG. 4, unlike the shift register 1' shown in FIG. 3, a shift register 1" shown in FIG. 4 has a pull-down control module 6" including a ninth transistor M9, whose control terminal and first terminal are connected to a second clock control signal line CK2. A second clock control signal supplied by the second clock control signal line CK2 has a reversed phase with respective to the first clock control signal supplied by the first clock control signal line CK1.

Compared to the shift registers shown in FIGS. 2 and 3, the shift register 1" shown in FIG. 4 provides the second clock control signal supplied by the second clock control signal line CK2 to the pull-down node PD, causing the pull-down node PD to be at a high electric level for a half of time, and at a low electric level for another half of time, which can prevent polarization of the fourteenth transistor M14.

It is to be noted that, the gate drive unit according to an embodiment of the present disclosure may include a shift register having various circuit designs, which are not enumerated herein.

Figure 5:
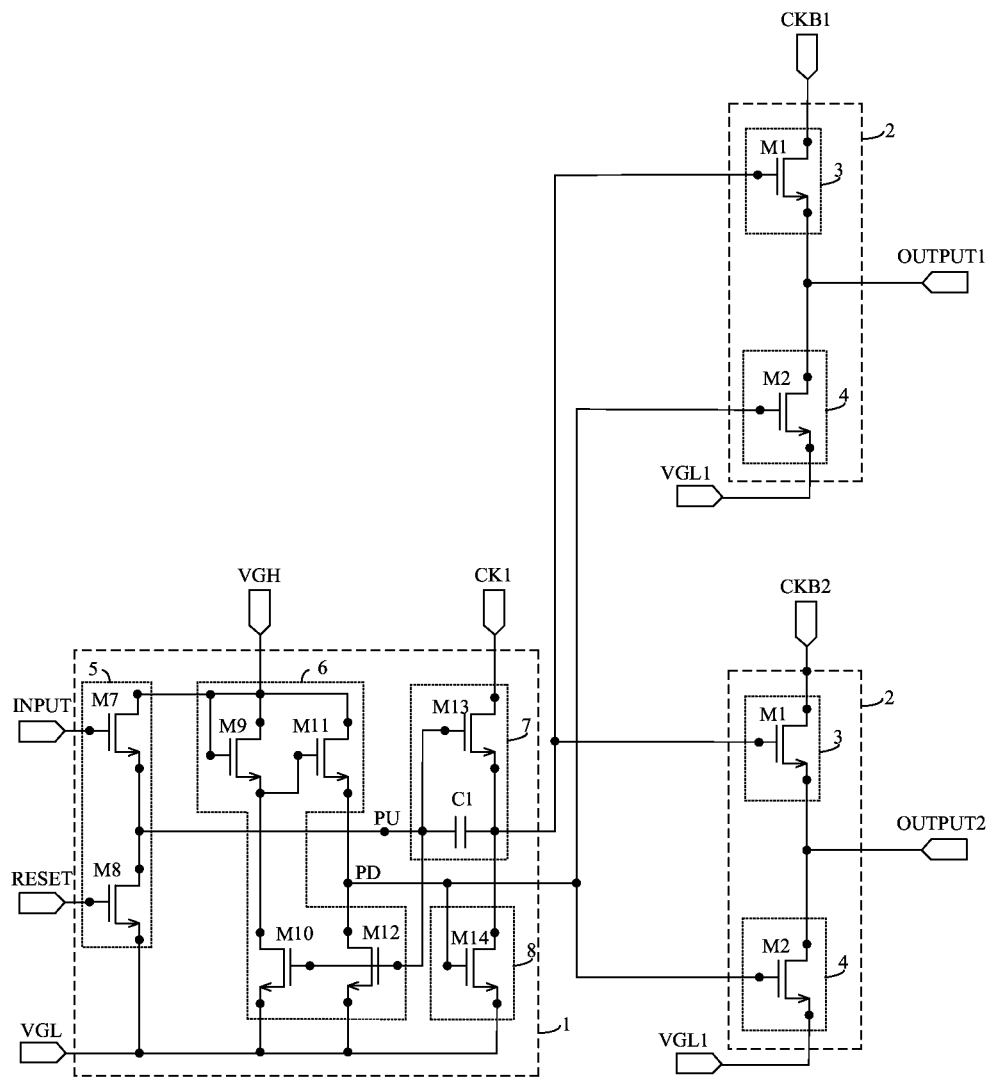
FIG. 5 is a schematic diagram of a circuit structure of the gate drive unit according to an embodiment of the present disclosure.

FIG. 5 is a schematic diagram of a circuit structure of the gate drive unit according to an embodiment of the present disclosure.

As shown in FIG. 5, the gate drive unit according to an embodiment of the present disclosure may include the shift register 1 shown in FIG. 2 and a plurality of output control modules 2 shown in FIG. 1C, but the present disclosure is not limited thereto. The gate drive unit according to an embodiment of the present disclosure may include the shift register 1' shown in FIG. 3 or the shift register 1" shown in FIG. 4 or a shift register having other circuit structure. FIG. 5 shows two output control modules 2, but the present disclosure is not limited thereto. The gate drive unit according to an embodiment of the present disclosure may include three or more output control modules.

Figure 6:
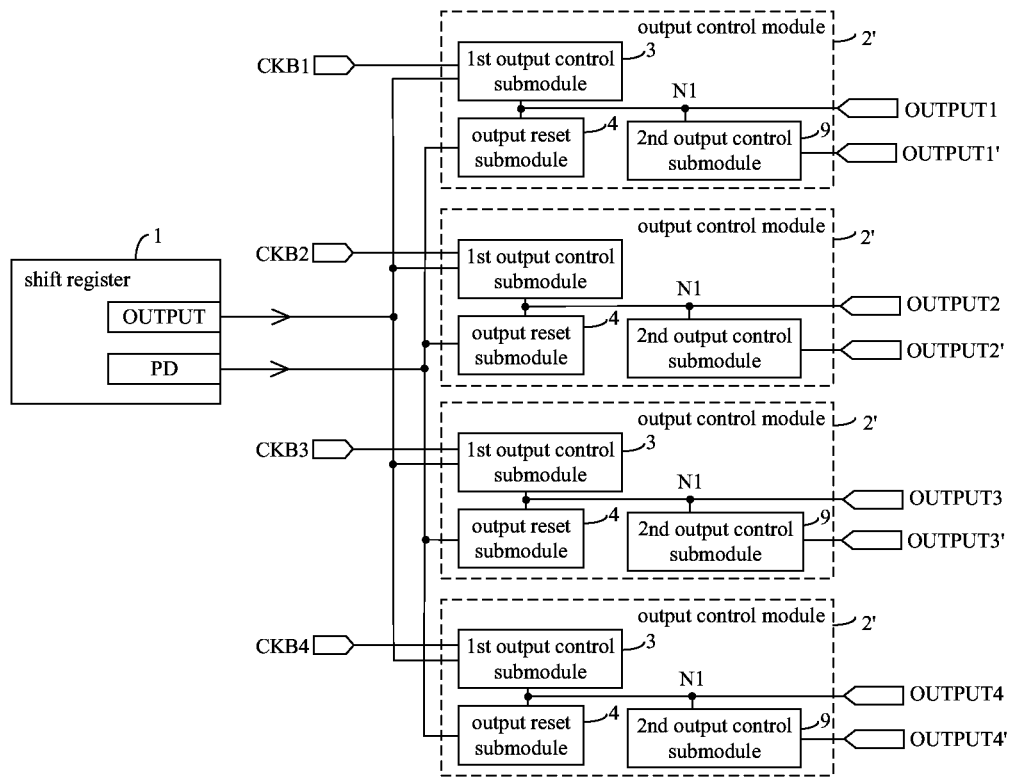
FIG. 6 is a schematic diagram of a structure of a gate drive unit according to another embodiment of the present disclosure.
Figure 7:
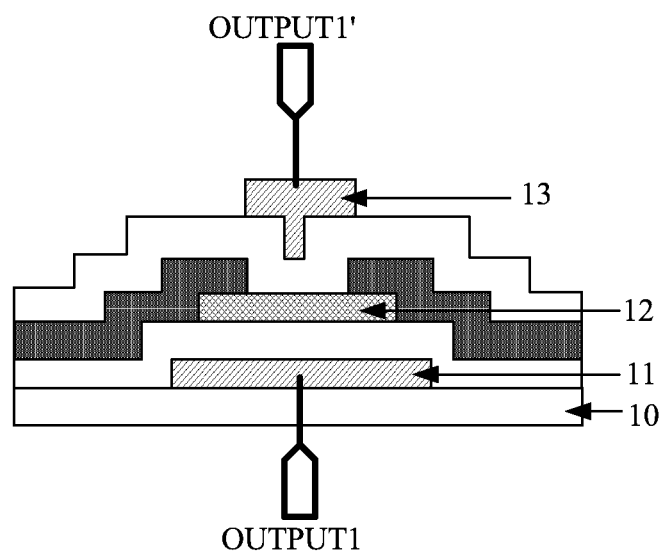
FIG. 7 schematically illustrates a schematic diagram of a structure of a switching transistor which receives a first scanning signal and a second scanning signal at the same time.

FIG. 6 is a schematic diagram of a structure of a gate drive unit according to another embodiment of the present disclosure, and FIG. 7 schematically illustrates a schematic diagram of a structure of a switching transistor which receives a first scanning signal and a second scanning signal at the same time.

As shown in FIG. 6, compared to the gate drive unit shown in FIG. 1, the gate drive unit shown in FIG. 6 has an output control module 2' further including a second output control submodule 9. The second output control submodule 9 is connected to a second scanning signal output terminal (one of OUTPUT1', OUTPUT2', OUTPUT3', and OUTPUT4') and the first scanning signal output terminal (one of OUTPUT1, OUTPUT2, OUTPUT3, and OUTPUT4), respectively. The second output control submodule 9 is configured to provide a second scanning signal having a reversed phase with respective to the first scanning signal to the second scanning signal output terminal (one of OUT- PUT1', OUTPUT2', OUTPUT3', and OUTPUT4'), under the control of the first scanning signal outputted by the first scanning signal output terminal (one of OUTPUT1, OUTPUT2, OUTPUT3, and OUTPUT4).

The output control module 2' will be described in detail below. For ease of description, a node connected to the second output control submodule 9, the first output control submodule 3 and the output reset submodule 4 of the output control module 2', and the first scanning signal output terminal (one of OUTPUT1, OUTPUT2, OUTPUT3, and OUTPUT4) is referred to as a first node N1.

In the present embodiment, a switching transistor in a pixel unit in a display region of the display panel may be driven using the first scanning signal outputted by the first scanning signal output terminal (for example, OUTPUT1) and the second scanning signal outputted by the second scanning signal output terminal (for example, OUTPUT1') simultaneously.

Referring to FIG. 7, the switching transistor may have two gates 11 and 13, the gate 11 is located below an active layer 12 (that is, a side of the active layer 12 facing a substrate 10), and the gate 13 is located above the active layer 12 (that is, a side of the active layer 12 facing away from the substrate 10).

An example is taken where the active layer 12 includes an N-type semiconductor material. In a case of not considering the gate 13 located above the active layer 12, when the gate 11 located below the active layer 12 is at a high electric level, the switching transistor is turned on, and when the gate 11 is at a low electric level, the switching transistor is turned off. In a case of not considering the gate 11 located below the active layer 12, when the gate 13 located above the active layer 12 is at a low electric level, the switching transistor is turned on, and when the gate 13 is at a high electric level, the switching transistor is turned off.

Thus, when the gate 11 located below the active layer 12 is at a high electric level and the gate 13 located above the active layer 12 is at a low electric level, the two gates 11 and 13 can better facilitate formation of a channel in the active layer 12, and can better turn on the switching transistor. Furthermore, a voltage value corresponding to the high electric level can be decreased effectively. When the gate 11 located below the active layer 12 is at a low electric level and the gate 13 located above the active layer 12 is at a high electric level, they can better turn off the switching transistor. In order to drive the switching transistor of FIG. 7, two gate lines need to be provided to deliver scanning signals having opposite phases to each other to the two gates 11 and 13 of the switching transistor, respectively.

The gate drive unit shown in FIG. 6 may be employed, the first scanning signal output terminal (for example, OUTPUT1) and the second scanning signal output terminal (for example, OUTPUT1') may be connected to the two gates 11 and 13 of the switching transistor via gate lines, respectively, and the first scanning signal outputted by the first scanning signal output terminal and the second scanning signal outputted by the second scanning signal output terminal have opposite phases to each other, so as to control the switching transistor to be better turned on or off.

Figure 8:
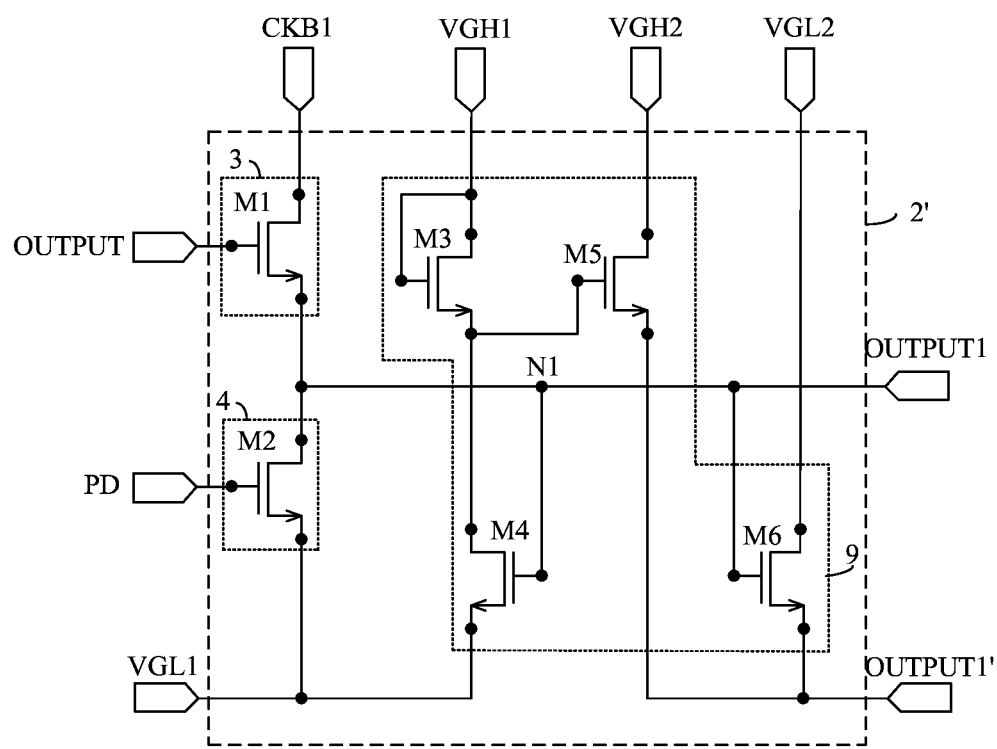
FIG. 8 is a schematic diagram of a circuit structure of one of output control modules of FIG. 6.

FIG. 8 is a schematic diagram of a circuit structure of one of output control modules 2' of FIG. 6.

As shown in FIG. 8, the first output control submodule 3 may include a first transistor M1, and the output reset submodule 4 may include a second transistor M2. The first transistor M1 and the second transistor M2 are connected in the same manner as that of FIG. 1C, detailed description of which is omitted herein.

The second output control submodule 9 may include a third transistor M3, a fourth transistor M4, a fifth transistor M5 and a sixth transistor M6. A control terminal and a first terminal of the third transistor M3 are connected to a second power supply VGH1, and a second terminal of the third transistor M3 is connected to both of a first terminal of the fourth transistor M4 and a control terminal of the fifth transistor M5. A control terminal of the fourth transistor M4 is connected to the first node N1, and a second terminal of the fourth transistor M4 is connected to a first power supply VGL1. A first terminal of the fifth transistor M5 is connected to a third power supply VGH2, and a second terminal of the fifth transistor M5 is connected to the corresponding second scanning signal output terminal (for example, OUTPUT1'). A control terminal of the sixth transistor M6 is connected to the first node N1, a first terminal of the sixth transistor M6 is connected to a fourth power supply VGL2, and a second terminal of the sixth transistor M6 is connected to the corresponding second scanning signal output terminal (for example, OUTPUT1').

Figure 9:
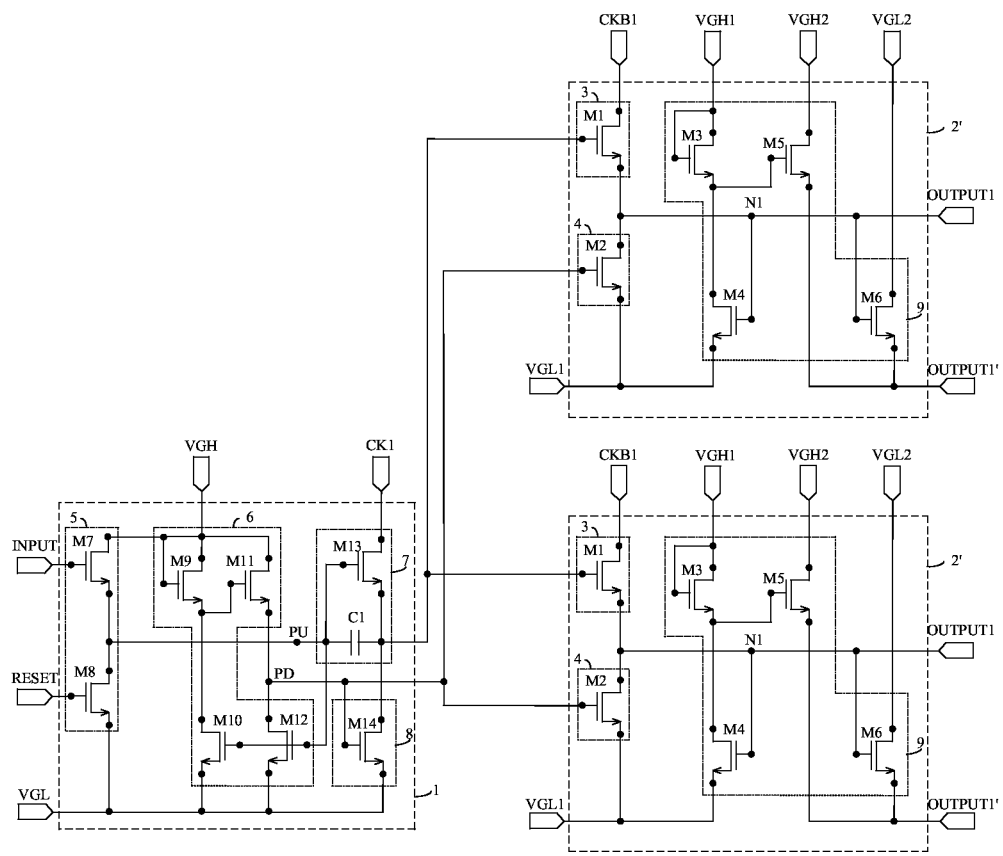
FIG. 9 is a schematic diagram of a circuit structure of a gate drive unit according to another embodiment of the present disclosure.

FIG. 9 is a schematic diagram of a circuit structure of a gate drive unit according to another embodiment of the present disclosure.

As shown in FIG. 9, the gate drive unit according to an embodiment of the present disclosure may include the shift register 1 shown in FIG. 2 and a plurality of output control modules 2' shown in FIG. 8, but the present disclosure is not limited thereto. The gate drive unit according to an embodiment of the present disclosure may include the shift register 1' shown in FIG. 3 or the shift register 1" shown in FIG. 4 or a shift register having other circuit structure. FIG. 9 shows two output control modules 2', but the present disclosure is not limited thereto. The gate drive unit according to an embodiment of the present disclosure may include three or more output control modules.

The operation process of the gate drive unit according to an embodiment of the present disclosure will be described in detail below in conjunction with FIGS. 6, and 8 to 10.

Figure 10:
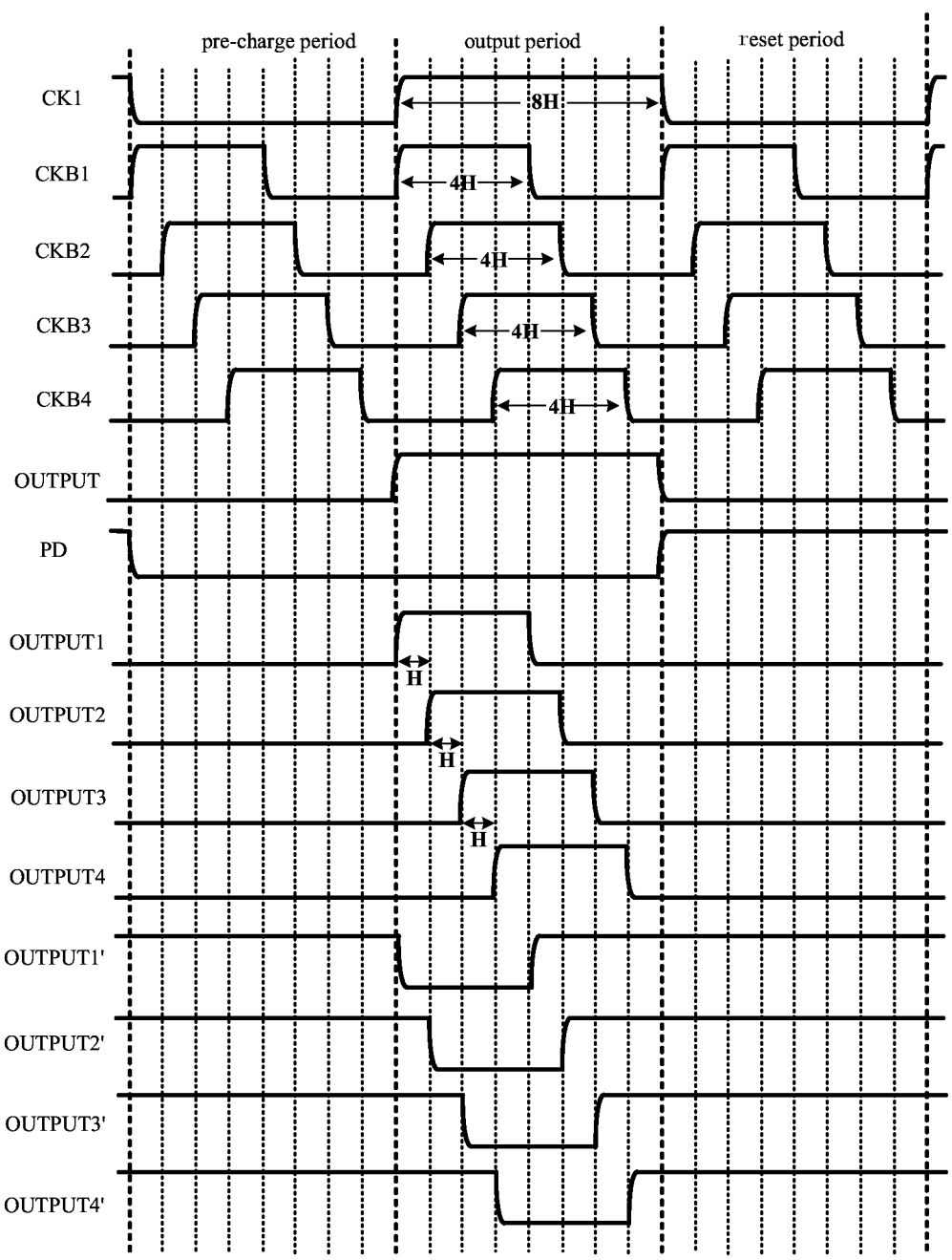
FIG. 10 is an operation timing diagram of a gate drive unit according to an embodiment of the present disclosure.

FIG. 10 is an operation timing diagram of a gate drive unit according to an embodiment of the present disclosure.

Referring to FIGS. 6, 9 and 10, the first power supply VGL1 supplies a low electric level voltage, the second power supply VGH1 supplies a high electric level voltage, the third power supply VGH2 supplies a high electric level voltage, and the fourth power supply VGL2 supplies a low electric level voltage. The first clock control signal in the first clock control signal line CK1 has a period of 16H (where H is a preset unit time), a duty ratio of 50%; the clock scanning signal of the clock scanning signal line (one of CKB1, CKB2, CKB3, and CKB4) connected to the output control module 2' has a period of 8H, a duty ratio of 50%, and clock scanning signals of the clock scanning signal lines are successively delayed by 1H.

As shown in FIG. 10, the operation process of the gate drive unit includes three periods: a pre-charge period, an output period and a reset period. The operation process of the shift register 1 has been described referring to FIG. 1B, which is not repeated herein. The following only describes the operation process of the output control module 2' in the gate drive unit.

In the pre-charge period, the signal outputted by the signal output terminal OUTPUT of the shift register 1 is at a low electric level, and the potential of the pull-down node PD is at a low electric level. At this time, the first transistor M1 and the second transistor M2 are both turned off, a potential of the first node N1 (that is, the node connected to the first scanning signal output terminal) maintains a low electric level state after the reset period of the previous cycle, causing the first scanning signal output terminal to output the first scanning signal at a low electric level state.

Referring to FIG. 8, since the potential of the first node N1 is at a low electric level, the fourth transistor M4 and the sixth transistor M6 are both turned off, and the high electric level voltage supplied by the second power supply VGH1 is provided to the control terminal of the fifth transistor M5 via the third transistor M3, turning on the fifth transistor M5. The high electric level voltage supplied by the third power supply VGH2 is provided to the second scanning signal output terminal (for example, OUTPUT1') via the fifth transistor M5, causing the second scanning signal output terminal (for example, OUTPUT1') to output the second scanning signal at a high electric level state.

In the output period, the signal outputted by the signal output terminal OUTPUT of the shift register 1 is at a high electric level, and the potential of the pull-down node PD is at a low electric level. At this time, the first transistor M1 is turned on, and the second transistor M2 is turned off.

Referring to FIG. 8, since the first transistor M1 is turned on, the clock scanning signal of the clock scanning signal line (for example, CKB1) connected to the output control module 2' may be provided to the first scanning signal output terminal (for example, OUTPUT1) via the first transistor M1. Referring to FIG. 10, since clock scanning signals in the four clock scanning signal lines CKB1, CKB2, CKB3, and CKB4 are successively delayed by 1H, the first scanning signals outputted by the four output control modules 2' will be delayed successively by 1H.

In the output period, when the clock scanning signal is at a high electric level, the potential of the first node N1 is also at a high electric level, thus the fourth transistor M4 and the sixth transistor M6 are both turned on. The low electric level voltage supplied by the first power supply VGL1 is provided to the control terminal of the fifth transistor M5 via the fourth transistor M4, turning off the fifth transistor M5. The low electric level voltage supplied by the fourth power supply VGL2 is provided to the second scanning signal output terminal (for example, OUTPUT1') via the sixth transistor M6, causing the second scanning signal outputted by the second scanning signal output terminal (for example, OUTPUT1') to be at a low electric level. When the clock scanning signal is at a low electric level, the potential of the first node N1 is also at a low electric level, thus the fourth transistor M4 and the sixth transistor M6 are both turned off. The high electric level voltage supplied by the second power supply VGH1 is provided to the control terminal of the fifth transistor M5 via the third transistor M3, turning on the fifth transistor M5. The high electric level voltage supplied by the third power supply VGH2 is provided to the second scanning signal output terminal (for example, OUTPUT1') via the fifth transistor M5, causing the second scanning signal output terminal (for example, OUTPUT1') to output the second scanning signal at a high electric level.

In the reset period, the signal outputted by the signal output terminal OUTPUT of the shift register 1 is at a low electric level, and the potential of the pull-down node PD is at a high electric level. At this time, the first transistor M1 is turned off, and the second transistor M2 is turned on.

Referring to FIG. 8, a low electric level voltage supplied by the first power supply VGL1 is provided to the first node N1 via the second transistor M2, causing the potential of the first node N1 to be at a low electric level, that is, the first scanning signal output terminal (for example, OUTPUT1) outputs the first scanning signal in a low electric level state. The fourth transistor M4 and the sixth transistor M6 are both turned off, the high electric level voltage supplied by the second power supply VGH1 is provided to the control terminal of the fifth transistor M5 via the third transistor M3, turning on the fifth transistor M5. The high electric level voltage supplied by the third power supply VGH2 is provided to the second scanning signal output terminal (for example, OUTPUT1') via the fifth transistor M5, causing the second scanning signal output terminal (for example, OUTPUT1') to output the second scanning signal in a high electric level state.

It is to be noted that, at some moments of time, at least two adjacent first scanning signal output terminals (for example, OUTPUT1 and OUTPUT2) simultaneously output first scanning signals in a high electric level state, which means that a high electric level is simultaneously loaded onto gate lines connected to these first scanning signal output terminals, tuning on the switching transistors connected to these gate lines at the same time. In this case, data signals corresponding to pixel units of the previous one or several lines may perform pre-charging on pixel electrodes of the current line. For example, in a time period for which the first scanning signal output terminal OUTPUT4 outputs the first scanning signal at a high electric level state, as shown in FIG. 10, within the first 3H of time when the first scanning signal output terminal OUTPUT4 outputs a high electric level, data signals corresponding to the pixel units of the first three lines will pre-charge pixel electrodes in the pixel units of the fourth line, thus, only within the last H of time when OUTPUT4 outputs a high electric level, is the real data signal corresponding to pixel units of the fourth line provided to the corresponding pixel electrode. That is, the first 3H of time when the first scanning signal output terminal outputs a high electric level is pre-charge time, and the last H of time is input time of the real data voltage signal.

Figure 11:
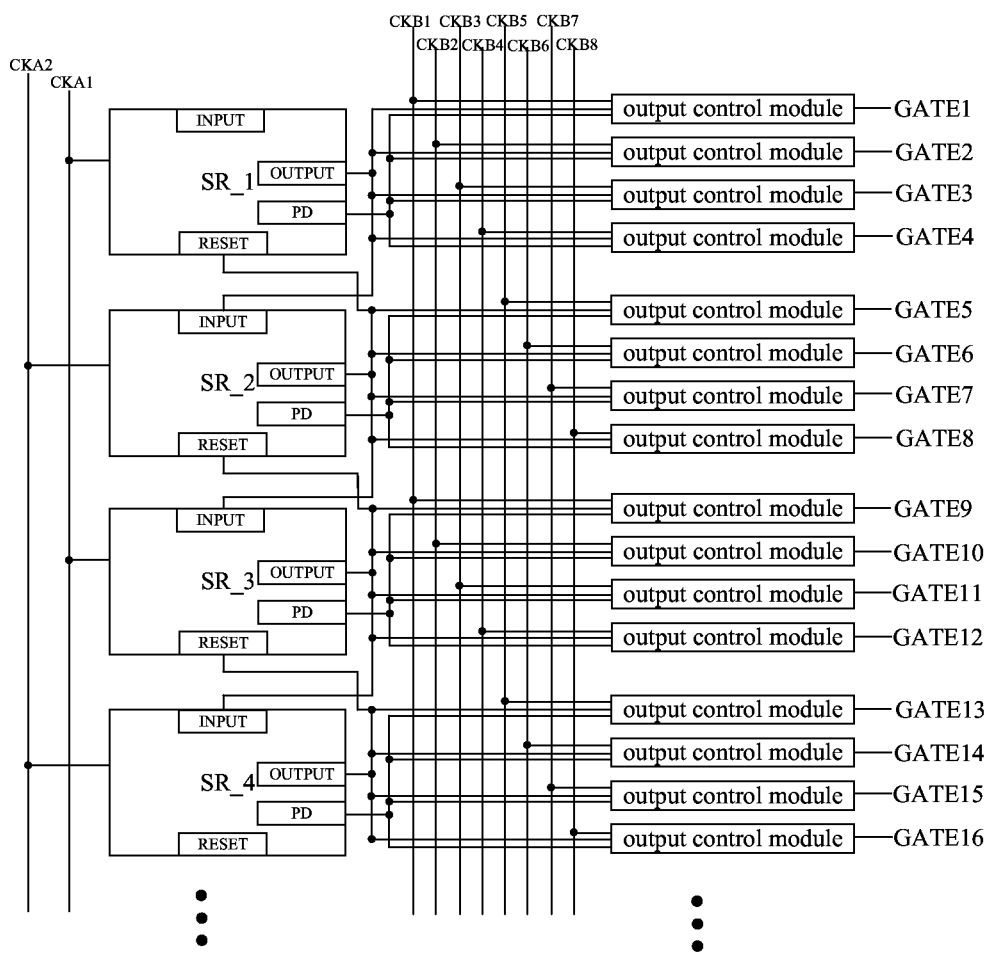
FIG. 11 is a schematic diagram of a structure of a gate drive circuit according to an embodiment of the present disclosure.

FIG. 11 is a schematic diagram of a structure of a gate drive circuit according to an embodiment of the present disclosure.

As shown in FIG. 11, the gate drive circuit according to an embodiment of the present disclosure may include a plurality of cascaded gate drive units, and the plurality of gate drive units may include at least one gate drive unit according to embodiments of the present disclosure. Except the gate drive unit at the last stage, the gate drive unit at each stage has a shift register (for example, SR_1, SR_2, SR_3, or SR_4) whose signal output terminal OUTPUT is connected to the pre-charge signal input terminal INPUT of a shift register of the gate drive unit at the next stage. Except the gate drive unit at the first stage, the gate drive unit at each stage has a shift register whose signal output terminal OUTPUT is connected to the reset signal input terminal RESET of a shift register of the gate drive unit at the previous stage.

As shown in FIG. 11, two first clock control signal lines CKA1 and CKA2 are provided, and two clock control signals respectively loaded to the two first clock control signal lines CKA1 and CKA2 have the same period, with a duty ratio of 50%, and have opposite phases to each other. Shift registers (for example, SR_1 and SR_3) in the gate drive units of odd-numbered stage (for example, the first stage, the third stage) are connected to the first clock control signal line CKA1, and shift registers (for example, SR_2 and SR_4) in the gate drive units of even-numbered stage (for example, the second stage, the fourth stage) are connected to the first clock control signal line CKA2.

Each gate drive unit may include m output control modules (for example, as shown in FIG. 11, include four output control modules), and each of the output control modules is connected to one of gate lines, respectively (for example, gate lines GATE1 to GATE16 as shown in FIG. 11). 2 m different clock scanning signal lines (for example, FIG. 11 shows eight clock scanning signal lines CKB1 to CKB8) are provided for the entire gate drive circuit. The first clock control signal of the first clock control signal lines (CKA1 and CKA2) connected to a shift register has a period of 4 mH, and a duty ratio of 50%. The clock scanning signal of each of the clock scanning signal lines (CKB1 to CKB8) has a period of 2 mH, and a duty ratio of 50%, and 2 m clock scanning signals are delayed successively by H. Gate drive units of odd-numbered stage correspond to the first to the m-th clock scanning signal lines (for example, CKB1 to CKB4), and gate drive units of even-numbered stage correspond to the (m+1)-th to the 2 m-th clock scanning signal lines (for example, CKB5 to CKB8).

FIG. 11 merely exemplarily shows a case where one gate drive unit includes four output control modules, but the present disclosure is not limited thereto.

Figure 12:
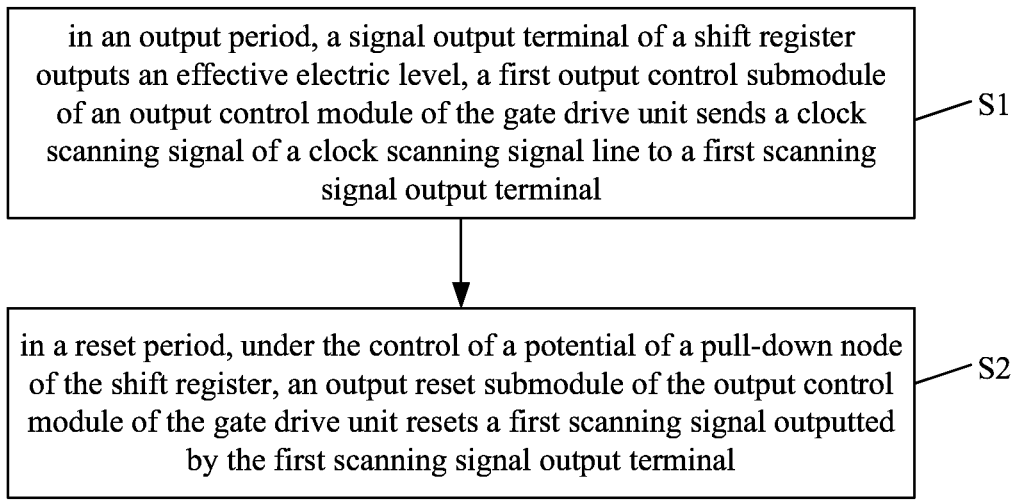
FIG. 12 is a flow chart of a driving method of a gate drive unit according to an embodiment of the present disclosure.

FIG. 12 is a flow chart of a driving method of a gate drive unit according to an embodiment of the present disclosure.

As shown in FIG. 12, the driving method of a gate drive unit according to an embodiment of the present disclosure may be used to drive the gate drive unit according to an embodiment of the present disclosure, and the driving method may include Steps S1 and S2.

In Step S1, in an output period, a signal output terminal of a shift register outputs an effective electric level, a first output control submodule of an output control module of the gate drive unit sends a clock scanning signal of a clock scanning signal line to a first scanning signal output terminal.

In Step S2, in a reset period, under the control of a potential of a pull-down node of the shift register, an output reset submodule of the output control module of the gate drive unit resets a first scanning signal outputted by the first scanning signal output terminal.

It should be understood that, the above embodiments are only exemplary embodiments for the purpose of explaining the principle of the present disclosure, and the present disclosure is not limited thereto. For one of ordinary skill in the art, various improvements and modifications may be made without departing from the spirit and essence of the present disclosure. These improvements and modifications also fall within the protection scope of the present disclosure.

What is claimed is:

1. A gate drive unit, comprising a shift register and a plurality of output control modules connected to the shift register, each of the plurality of output control modules connected to a clock scanning signal line and a first scanning signal output terminal corresponding to the output control module, respectively, wherein
  each of the plurality of output control modules comprises a first output control submodule and an output reset submodule,
  the first output control submodule is connected to a signal output terminal of the shift register, the clock scanning signal line corresponding to the output control module, and the first scanning signal output terminal corresponding to the output control module, respectively, and the first output control submodule is configured to send a clock scanning signal of the clock scanning signal line to the first scanning signal output terminal, under control of a signal outputted by the signal output terminal of the shift register, and the output reset submodule is connected to a pull-down node of the shift register and the first scanning signal output terminal, respectively, and the output reset submodule is configured to reset a first scanning signal outputted by the first scanning signal output terminal, under control of a potential of the pull-down node of the shift register;
  wherein each of the plurality of output control modules further comprises a second output control submodule; the second output control submodule is connected to a second scanning signal output terminal corresponding to the output control module and the first scanning signal output terminal, respectively; and the second output control submodule is configured to provide a second scanning signal having a reversed phase with respect to the first scanning signal to the second scanning signal output terminal, under control of the first scanning signal outputted by the first scanning signal output terminal;
  wherein the second output control submodule comprises a third transistor, a fourth transistor, a fifth transistor and a sixth transistor; a control terminal and a first terminal of the third transistor are connected to a second power supply, and a second terminal of the third transistor is connected to both of a first terminal of the fourth transistor and a control terminal of the fifth transistor; a control terminal of the fourth transistor is connected to the first scanning signal output terminal, and a second terminal of the fourth transistor is connected to the first power supply; a first terminal of the fifth transistor is connected to a third power supply, and a second terminal of the fifth transistor is connected to the second scanning signal output terminal; and a control terminal of the sixth transistor is connected to the first scanning signal output terminal, a first terminal of the sixth transistor is connected to a fourth power supply, and a second terminal of the sixth transistor is connected to the second scanning signal output terminal; and
  wherein the sixth transistor comprises a substrate, a first gate, an active layer, and a second gate; the first gate is located on a side of the active layer facing the substrate, and the second gate is located on a side of the active layer facing away from the substrate; and the first gate and second gate are connected to the first scanning signal output terminal and the second scanning signal output terminal via gate lines, respectively.

2. The gate drive unit according to claim 1, wherein the first output control submodule comprises a first transistor,
  a control terminal of the first transistor is connected to the signal output terminal of the shift register, a first terminal of the first transistor is connected to the clock scanning signal line, and a second terminal of the first transistor is connected to the first scanning signal output terminal.

3. The gate drive unit according to claim 2, wherein the output reset submodule comprises a second transistor,
  a control terminal of the second transistor is connected to the pull-down node of the shift register, a first terminal of the second transistor is connected to the first scanning signal output terminal, and a second terminal of the second transistor is connected to a first power supply.

4. The gate drive unit according to claim 3, wherein the shift register comprises a pre-charge/reset module, a pull-down control module, a pull-up module and a pulldown module, and the shift register further comprises a pre-charge signal input terminal, a reset signal input terminal and the signal output terminal, the pre-charge/reset module, the pull-down control module, and the pull-up module are connected to a pull-up node of the shift register, the pull-down module and the pull-down control module are connected to the pull-down node, the pre-charge/reset module is connected to the pre-charge signal input terminal and the reset signal input terminal, and the pull-up module and the pull-down module are connected to the signal output terminal, the pre-charge/reset module is configured to perform a pre-charge process or a reset process on the pull-up node, under control of a pre-charge signal inputted by the pre-charge signal input terminal and a reset signal inputted by the reset signal input terminal, respectively, the pull-down control module is configured to control a potential of the pull-down node under control of a potential of the pull-up node, the pull-up module is configured to pull up a signal outputted by the signal output terminal under control of a potential of the pull-up node, and the pull-down module is configured to pull down a signal outputted by the signal output terminal under control of a potential of the pull-down node.

5. The gate drive unit according to claim 4, wherein the pre-charge/reset module comprises a seventh transistor and an eighth transistor, a control terminal of the seventh transistor is connected to the pre-charge signal input terminal, a first terminal of the seventh transistor is connected to a fifth power supply, and a second terminal of the seventh transistor is connected to the pull-up node, and a control terminal of the eighth transistor is connected to the reset signal input terminal, a first terminal of the eighth transistor is connected to the pull-up node, and a second terminal of the eighth transistor is connected to a sixth power supply.

6. The gate drive unit according to claim 5, wherein the pull-up module comprises a thirteenth transistor and a first capacitor, a control terminal of the thirteenth transistor is connected to the pull-up node, a first terminal of the thirteenth transistor is connected to a first clock control signal line, and a second terminal of the thirteenth transistor is connected to the signal output terminal, and a first terminal of the first capacitor is connected to the pull-up node, and a second terminal of the first capacitor is connected to the signal output terminal.

7. The gate drive unit according to claim 6, wherein the pull-down module comprises a fourteenth transistor, a control terminal of the fourteenth transistor is connected to the pull-down node, a first terminal of the fourteenth transistor is connected to the signal output terminal, and a second terminal of the fourteenth transistor is connected to the sixth power supply.

8. The gate drive unit according to claim 7, wherein the pull-down control module comprises a ninth transistor and a tenth transistor, a control terminal and a first terminal of the ninth transistor are both connected to a second clock control signal line, and a second terminal of the ninth transistor is connected to the pull-down node, and a control terminal of the tenth transistor is connected to the pull-up node, a first terminal of the tenth transistor is connected to the pull-down node, and a second terminal of the tenth transistor is connected to the sixth power supply.

9. The gate drive unit according to claim 7, wherein the pull-down control module comprises a ninth transistor, a tenth transistor, an eleventh transistor and a twelfth transistor, a control terminal and a first terminal of the ninth transistor are connected to the fifth power supply, and a second terminal of the ninth transistor is connected to a first terminal of the tenth transistor and a control terminal of the eleventh transistor, a control terminal of the tenth transistor is connected to the pull-up node, and a second terminal of the tenth transistor is connected to the sixth power supply, a first terminal of the eleventh transistor is connected to the fifth power supply, and a second terminal of the eleventh transistor is connected to the pull-down node, and a control terminal of the twelfth transistor is connected to the pull-up node, a first terminal of the twelfth transistor is connected to the pull-down node, and a second terminal of the twelfth transistor is connected to the sixth power supply.

10. The gate drive unit according to claim 1, wherein the shift register comprises a pre-charge/reset module, a pull-down control module, a pull-up module and a pull-down module, and the shift register further comprises a pre-charge signal input terminal, a reset signal input terminal and the signal output terminal, the pre-charge/reset module, the pull-down control module, and the pull-up module are connected to a pull-up node of the shift register, the pull-down module and the pull-down control module are connected to the pull-down node, the pre-charge/reset module is connected to the pre-charge signal input terminal and the reset signal input terminal, and the pull-up module and the pull-down module are connected to the signal output terminal, the pre-charge/reset module is configured to perform a pre-charge process or a reset process on the pull-up node, under control of a pre-charge signal inputted by the pre-charge signal input terminal and a reset signal inputted by the reset signal input terminal, respectively, the pull-down control module is configured to control a potential of the pull-down node under control of a potential of the pull-up node, the pull-up module is configured to pull up a signal outputted by the signal output terminal under control of a potential of the pull-up node, and the pull-down module is configured to pull down a signal outputted by the signal output terminal under control of a potential of the pull-down node.

11. The gate drive unit according to claim 10, wherein the pre-charge/reset module comprises a seventh transistor and an eighth transistor, a control terminal of the seventh transistor is connected to the pre-charge signal input terminal, a first terminal of the seventh transistor is connected to a fifth power supply, and a second terminal of the seventh transistor is connected to the pull-up node, and a control terminal of the eighth transistor is connected to the reset signal input terminal, a first terminal of the eighth transistor is connected to the pull-up node, and a second terminal of the eighth transistor is connected to a sixth power supply.

12. The gate drive unit according to claim 11, wherein the pull-up module comprises a thirteenth transistor and a first capacitor,
   a control terminal of the thirteenth transistor is connected to the pull-up node, a first terminal of the thirteenth transistor is connected to a first clock control signal line, and a second terminal of the thirteenth transistor is connected to the signal output terminal, and
   a first terminal of the first capacitor is connected to the pull-up node, and a second terminal of the first capacitor is connected to the signal output terminal.

13. The gate drive unit according to claim 12, wherein the pull-down module comprises a fourteenth transistor,
   a control terminal of the fourteenth transistor is connected to the pull-down node, a first terminal of the fourteenth transistor is connected to the signal output terminal, and a second terminal of the fourteenth transistor is connected to the sixth power supply.

14. The gate drive unit according to claim 13, wherein the pull-down control module comprises a ninth transistor and a tenth transistor,
   a control terminal and a first terminal of the ninth transistor are both connected to a second clock control signal line, and a second terminal of the ninth transistor is connected to the pull-down node, and
   a control terminal of the tenth transistor is connected to the pull-up node, a first terminal of the tenth transistor is connected to the pull-down node, and a second terminal of the tenth transistor is connected to the sixth power supply.

15. The gate drive unit according to claim 13, wherein the pull-down control module comprises a ninth transistor, a tenth transistor, an eleventh transistor and a twelfth transistor,
   a control terminal and a first terminal of the ninth transistor are connected to the fifth power supply, and a second terminal of the ninth transistor is connected to a first terminal of the tenth transistor and a control terminal of the eleventh transistor,
   a control terminal of the tenth transistor is connected to the pull-up node, and a second terminal of the tenth transistor is connected to the sixth power supply,
   a first terminal of the eleventh transistor is connected to the fifth power supply, and a second terminal of the eleventh transistor is connected to the pull-down node, and
   a control terminal of the twelfth transistor is connected to the pull-up node, a first terminal of the twelfth transistor is connected to the pull-down node, and a second terminal of the twelfth transistor is connected to the sixth power supply.

16. The gate drive unit according to claim 1, wherein the number of the plurality of output control modules is in a range of 2 to 4.

17. A gate drive circuit, comprising a plurality of cascaded gate drive units, wherein the plurality of gate drive units comprise at least one gate drive unit according to claim 1,
   except the gate drive unit at the last stage, a shift register of the gate drive unit at each stage has a signal output terminal connected to a pre-charge signal input terminal of a shift register of the gate drive unit at the next stage, and
   except the gate drive unit at the first stage, the shift register of the gate drive unit at each stage has the signal output terminal connected to a reset signal input terminal of a shift register of the gate drive unit at the previous stage.

18. A driving method of a gate drive unit, the gate drive unit comprising a shift register and a plurality of output control modules connected to the shift register, each of the plurality of output control modules connected to a clock scanning signal line and a first scanning signal output terminal corresponding to the output control module, respectively, wherein
   each of the plurality of output control modules comprises a first output control submodule and an output reset submodule,
   the first output control submodule is connected to a signal output terminal of the shift register, the clock scanning signal line corresponding to the output control module, and the first scanning signal output terminal corresponding to the output control module, respectively, and the first output control submodule is configured to send a clock scanning signal of the clock scanning signal line to the first scanning signal output terminal, under control of a signal outputted by the signal output terminal of the shift register, and
   the output reset submodule is connected to a pull-down node of the shift register and the first scanning signal output terminal, respectively, and the output reset submodule is configured to reset a first scanning signal outputted by the first scanning signal output terminal, under control of a potential of the pull-down node of the shift register,
   the driving method comprises:
   in an output period, outputting, by the signal output terminal of the shift register, an effective electric level, sending, by the first output control submodule of each of the plurality of output control modules, the clock scanning signal of the clock scanning signal line to the first scanning signal output terminal; and
   in a reset period, under control of the potential of the pull-down node of the shift register, resetting, by the output reset submodule, the first scanning signal outputted by the first scanning signal output terminal;
   wherein each of the plurality of output control modules further comprises a second output control submodule; the second output control submodule is connected to a second scanning signal output terminal corresponding to the output control module and the first scanning signal output terminal, respectively; and the second output control submodule is configured to provide a second scanning signal having a reversed phase with respective to the first scanning signal to the second scanning signal output terminal, under control of the first scanning signal outputted by the first scanning signal output terminal;
   wherein the second output control submodule comprises a third transistor, a fourth transistor, a fifth transistor and a sixth transistor; a control terminal and a first terminal of the third transistor are connected to a second power supply, and a second terminal of the third transistor is connected to both of a first terminal of the fourth transistor and a control terminal of the fifth transistor; a control terminal of the fourth transistor is connected to the first scanning signal output terminal, and a second terminal of the fourth transistor is connected to the first power supply; a first terminal of the fifth transistor is connected to a third power supply, and a second terminal of the fifth transistor is connected to the second scanning signal output terminal; and a control terminal of the sixth transistor is connected to the first scanning signal output terminal, a first terminal of the sixth transistor is connected to a fourth power supply, and a second terminal of the sixth transistor is connected to the second scanning signal output terminal; and wherein the sixth transistor comprises a substrate, a first gate, an active layer, and a second gate; the first gate is located on a side of the active layer facing the substrate, and the second gate is located on a side of the active layer facing away from the substrate; and the first gate and second gate are connected to the first scanning signal output terminal and the second scanning signal output terminal via gate lines, respectively.

* * * * *